(12) United States Patent
Zwadlo

(10) Patent No.: US 7,279,254 B2
(45) Date of Patent: Oct. 9, 2007

(54) METHOD OF MAKING AN ARTICLE BEARING A RELIEF IMAGE USING A REMOVABLE FILM

(75) Inventor: Gregory L. Zwadlo, River Falls, WI (US)

(73) Assignee: Eastman Kodak Company, Rochester, NY (US)

( * ) Notice: Subject to any disclaimer, the term of this patent is extended or adjusted under 35 U.S.C. 154(b) by 319 days.

(21) Appl. No.: 11/130,065

(22) Filed: May 16, 2005

(65) Prior Publication Data
US 2006/0257780 A1 Nov. 16, 2006

(51) Int. Cl.
G03F 7/20 (2006.01)
G03F 1/00 (2006.01)
G03F 1/02 (2006.01)
G03F 7/30 (2006.01)
G03F 7/36 (2006.01)

(52) U.S. Cl. .................. 430/5; 430/200; 430/253; 430/254; 430/256; 430/306; 430/327; 430/328

(58) Field of Classification Search .............. 430/5, 430/200, 253, 254, 256, 306, 327, 328
See application file for complete search history.

(56) References Cited

U.S. PATENT DOCUMENTS

| | | |
|---|---|---|
| 3,867,150 A | 2/1975 | Ketley |
| 4,508,802 A | 4/1985 | Heiart et al. |
| 4,518,667 A | 5/1985 | Heiart et al. |
| 4,555,471 A * | 11/1985 | Barzynski et al. ....... 430/273.1 |
| 5,262,275 A | 11/1993 | Fan |
| 5,705,310 A | 1/1998 | Van Zoeren |
| 5,719,009 A | 2/1998 | Fan |
| 5,998,088 A | 12/1999 | Robello et al. |
| 6,020,108 A | 2/2000 | Goffing et al. |
| 6,037,102 A | 3/2000 | Loerzer et al. |
| 6,460,957 B1 | 10/2002 | Quintens et al. |
| 6,521,390 B1 | 2/2003 | Leinenbach et al. |
| 6,599,679 B2 | 7/2003 | Philipp et al. |
| 6,759,175 B2 | 7/2004 | Daems et al. |

FOREIGN PATENT DOCUMENTS

| | | |
|---|---|---|
| DE | 41 07 378 | 9/1992 |
| WO | 81/01474 | 5/1981 |
| WO | 93/03928 | 3/1993 |

* cited by examiner

Primary Examiner—Richard L. Schilling
(74) Attorney, Agent, or Firm—J Lanny Tucker (57) ABSTRACT

The invention is directed to methods of making an article bearing a relief image using a removable film. First, an imageable film that contains at least a mask substrate and an imageable material is imagewise exposed to imaging radiation to form an imaged film. The imaged film is then transferred to an imageable article, such as a flexographic printing plate precursor. The resulting assembly is exposed to curing radiation resulting in exposed and unexposed areas of photosensitive material on the imageable article. Following exposure to curing radiation, the imaged film is then removed from the imageable article. The imageable article is then developed with a suitable developer to form a relief image. The imaged film may then be reused to make additional articles bearing the relief image.

27 Claims, 3 Drawing Sheets

METHOD OF MAKING AN ARTICLE BEARING A RELIEF IMAGE USING A REMOVABLE FILM

BACKGROUND

The present invention is directed to methods of making an article bearing a relief image using a removable film that may be reused to make additional articles bearing the relief image.

Many methods of forming a relief image are known in the graphic arts. Photosensitive articles comprising an ablatable mask layer on the surface of a photosensitive polymer (or a so-called "integral mask") may be made into articles bearing a relief image without the use of a photographic negative or other separate masking device. These photosensitive articles are formed into relief images by first imagewise exposing the photosensitive article with laser radiation (generally from an infrared laser under computer control) to selectively remove the mask layer in the exposed areas, and then overall exposing with an actinic radiation to cure the photosensitive layer in the unmasked areas. The remaining areas of the mask layer and the non-hardened portions of the photosensitive layer are then removed by one or more liquid development processes. Examples of flexographic articles having an integral mask are described in U.S. Pat. No. 5,262,275 to Fan, U.S. Pat. No. 5,705,310 to Van Zoeren, U.S. Pat. No. 5,719,009 to Fan, U.S. Pat. No. 6,020,108 to Goffing, et al., and U.S. Pat. No. 6,037,102 to Loerzer, et al. U.S. Pat. No. 6,759,175 to Daems et al. reports a method of laminating an ablatable mask layer to a UV-sensitive material with the use of an adhesive to create an integral mask on the UV-sensitive material before imaging the integral mask and curing the UV-sensitive material.

While elements having a laser ablatable mask layer allow direct imagewise exposure with a laser and do not require a separate masking device, the imaging time to create the mask is very long since the sensitivity to infrared radiation is low for the known integral mask systems. Sensitivity is generally not lower than about 1 J/cm$^2$, and is more typically about 3 j/cm$^2$.

In recent years attempts have been made, such as reported in U.S. Pat. No. 6,521,390 to Leinenbach, et al., to improve the infrared sensitivity of an ablatable mask layer by using heat-combustible polymeric binders and specific aliphatic diesters. Although higher sensitivity and, as such, shorter exposure time may be achieved, this construction suffers from undesirable adhesion of the ablatable mask layer to a coversheet that must be removed before exposure; see U.S. Pat. No. 6,599,679 to Philipp, et al. at C1 and C2, Table 2.

Higher sensitivity is difficult with the integral mask construction as the laser ablatable layer must satisfy a number of widely varying quality criteria; see U.S. Pat. No. 6,599,679, col. 2, line 1-29. The use of a polyether-polyurethane binder in an ablatable layer is reported in U.S. Pat. No. 6,599,679, but the enhancement in imaging speed was modest (Examples 1-3 reported at Table 2; cf. Comparative Example C6).

Furthermore, the integral mask approach for the production of flexographic printing plates requires the use of high-powered laser-equipped imagers specifically configured for imaging the integral mask flexographic articles, such as CYREL Digital Imager (CDI SPARK) manufactured by Esko-Graphics (Kennesaw, Ga.), and ThermoFlex by Creo (Burnaby, British Columbia). Because of the need for varying the thicknesses of flexographic plates depending upon the specific printing application, more than one imager may be required with the integral mask flexographic articles. In contrast, conventional imaging apparatus for "computer-to-plate" lithographic applications (e.g., TRENDSETTER from Creo), and digital proofing applications (e.g., DESERTCAT 88 from ECRM) may be used in the present invention.

An analog method is also known to produce a relief image on an imageable material. In the typical analog method, a non-adhesive mask is formed via one of many processes, such as silver halide emulsion. The mask is then placed on the photosensitive material for exposure. Since these masks do not adhere to the photosensitive material, they tend to slip during the exposure step. To keep the mask from slipping while the photosensitive material is exposed to radiation, the step of exposing is done in a vacuum. The vacuum pulls the mask to the photosensitive material thus eliminating any space or air pockets that may be trapped between the mask and the photosensitive material, thus providing optical contact between the mask and the photosensitive material. If optical contact is not achieved, the light in the exposure step may scatter when it reaches the pockets of air resulting in a relief image that is not an exact representation of the intended image on the mask. The vacuum also prevents the mask from slipping during the exposure step. This feature of analog printing methods is commonly known as "vacuum draw-down." In at least one respect, the method of the present invention differs from the analog method in that the present invention utilizes an imaged film that adheres to the imageable article during the curing step so that the vacuum draw-down step is not required. However, the imaged film also has the characteristic in that it may be removed from the imageable article and reused.

SUMMARY OF THE INVENTION

In one embodiment the method includes the steps of imagewise exposing an imageable film containing imageable material to imaging radiation to form an imaged film, laminating the imaged film to an imageable article that includes a photosensitive material and a releasing layer, exposing the imageable article to curing radiation through the imaged film, removing the imaged film from the imageable article so that the imaged film is reusable, and developing the imageable article to form the relief image.

The releasing layer facilitates removal of the imaged film after the imageable article is exposed to the curing radiation. Commercial embodiments of printing plate precursors often include a releasing layer coated onto the photosensitive material.

In another embodiment, the invention includes a method of reusing the imaged film. This embodiment further includes the steps of laminating the imaged film to a second imageable article, exposing the second imageable article to curing radiation through the imaged film, removing the imaged film from the second imageable article so that the imaged film is reusable, and developing the imageable article to form the relief image. These steps may be repeated with additional imageable articles.

Issues related to handling, mounting, and spinning in drum-based imaging systems of thick flexographic articles (with associated tendency for cracking, fingerprinting, etc.) may be avoided by using the method of the present invention. For example, if the imageable article is a thick flexographic printing plate precursor, the flexographic precursor may be cured while remaining substantially flat after the imaged film is transferred to the flexographic precursor.

Yet another advantage of the invention is that the imaged film and mask image may be examined prior to transferring the imaged film to the imageable article. This permits the mask image to be "proofed" and corrected before a relief image is produced. Since the imageable article is typically much more expensive than the imageable film used for making the mask image, cost savings can be realized in the production of relief images. This is particularly the case when the imageable article is a flexographic precursor.

The methods provided by the present invention are advantageous as compared to the integral mask method of forming relief images. For example, the mask image may be made in significantly less time due to much greater imaging sensitivity than when an integral mask article is imaged. In some embodiments of the present invention, for example, only about 0.5 J/cm$^2$ is required to form the mask image, as compared to 1.7-2.0 J/cm$^2$ for integral masks; see U.S. Pat. No. 6,599,679 to Philipp, et al., Examples 1-3 reported at Table 2. Additionally, the mask image of the present invention may be reused whereas integral masks are developed with the uncured photosensitive material and are therefore not reusable.

The achievement of higher imaging sensitivity in making a mask image by the present invention allows the use of lower-cost imagers, at reasonable throughput, due to the fact that less powerful lasers are required than for previously known integral mask imaging systems. Since the imaging apparatus used in the practice of the invention are lower in cost and are more widely employed than the specialized flexographic imagers, the present invention permits the production of flexographic plates in more commercial settings. The use of commercially available computer-to-plate ("CTP") devices for plates and proofing enables the use of the same imaging apparatus to make mask images (according to the present invention) for the production of flexographic plates, proofing films for lithographic printing plates, or CTP lithographic plates.

Since a transferable mask can be used in combination with a variety of photosensitive materials and applications, a transferable mask also provides flexibility in production. A transferable mask can also be used in combination with commercially available photosensitive materials on an as-needed basis.

BRIEF DESCRIPTION OF THE DRAWINGS

FIGS. 1A-1E schematically illustrate a method of the invention that includes:

(1A) digitally creating an imaged film comprising from an imageable film a mask substrate and a layer of imageable material;

(1B) laminating the imaged film onto a flexographic precursor comprising a photosensitive material on a photosensitive substrate and a releasing layer on the photosensitive material;

(1C) exposing the flexographic precursor to curing radiation;

(1D) removing the imaged film from the flexographic precursor; and (1E) developing the flexographic precursor to provide a flexographic printing plate bearing a relief image.

DETAILED DESCRIPTION

The steps of the inventive method and the components used in this method are described further below.

I. Imagewise Exposing the Imageable Film to Imaging Radiation

One step of the method includes imagewise exposing an imageable film to an imaging radiation, resulting in an imaged film that is subsequently used to form a relief image. The step of imagewise exposing the imageable film to an imaging radiation produces exposed areas and unexposed areas of the imageable material. The exposed areas of the imageable material may then be removed from the film through various imaging mechanisms. A variety of imaging mechanisms are suitable for forming the imaged film. The type of imaging mechanism chosen to form the imaged film will determine the possible variations of the imageable film, as discussed below.

A. Imageable Film

The imageable film includes at least a mask substrate and an imageable material. The imageable material is generally disposed on the mask substrate as a relatively uniform coating of one or more layers. The imageable film may optionally include one or more additional layers, such as a subbing layer or an ablatable layer.

Figure 2A:
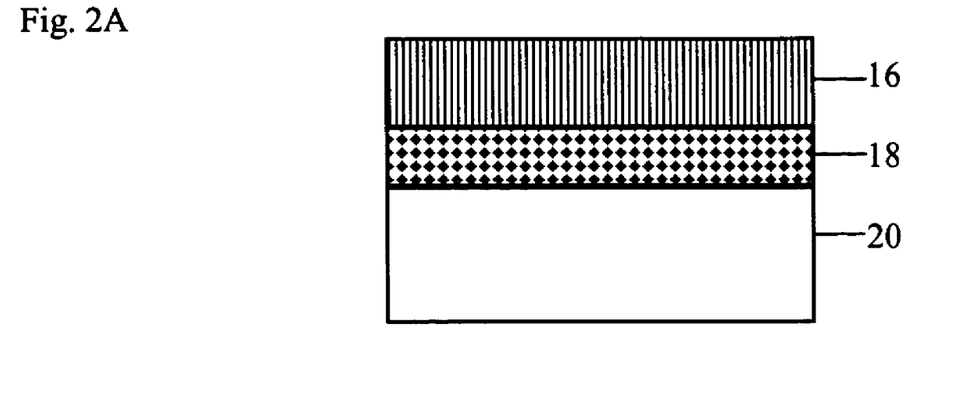
FIG. 2A illustrates a cross-sectional view of one embodiment of the imageable film that includes a mask substrate, a subbing layer and an imageable material.

In one embodiment, illustrated in FIG. 2A, the imageable film includes a subbing layer 18 disposed on the mask substrate 20, and an imageable material 16 disposed on the subbing layer 18.

Figure 2B:
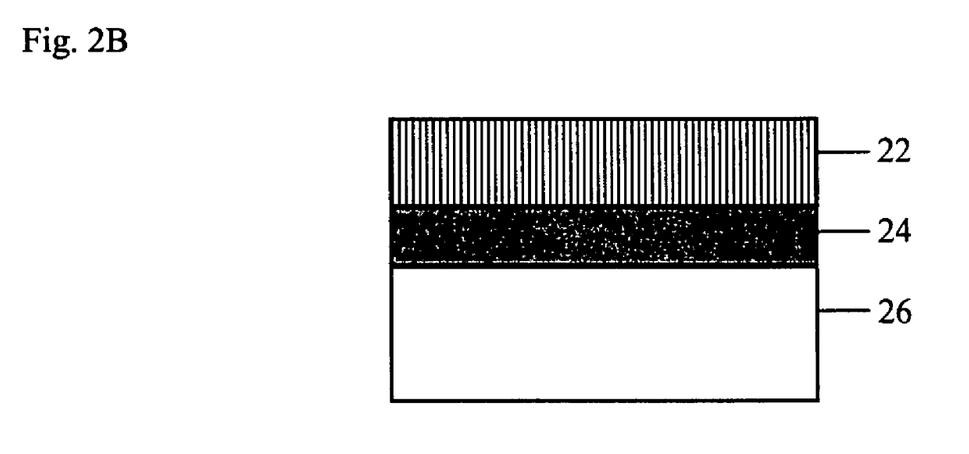
FIG. 2B illustrates a cross-sectional view of another embodiment of the imageable film that includes a mask substrate, an ablatable layer, and an imageable material.

In another embodiment, illustrated in FIG. 2B, the imageable film includes an ablatable layer 24 disposed on the mask substrate 26 and an imageable material 22 disposed on the ablatable layer 24.

Figure 2C:
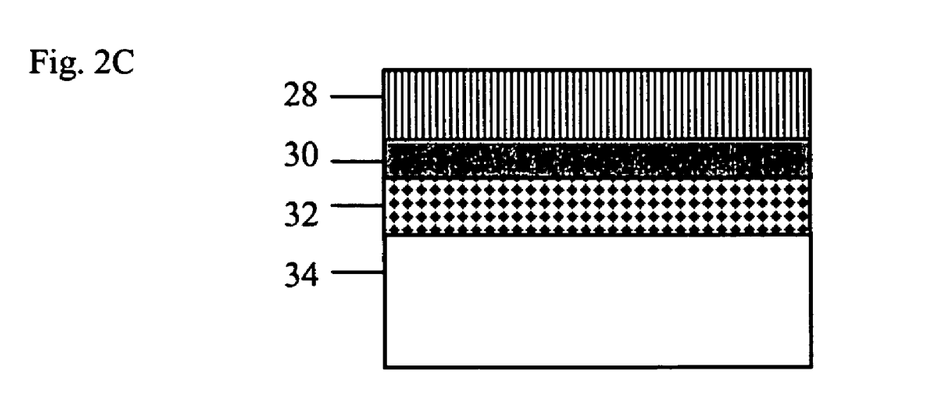
FIG. 2C illustrates a cross-sectional view of another embodiment of the imageable film that includes a mask substrate, a subbing layer, an ablatable layer and an imageable material.

In still another embodiment, the imageable film includes a subbing layer 32 disposed on the mask substrate 34, an ablatable layer 30 disposed on the subbing layer 32, and an imageable material 28 disposed on the ablatable layer 30.

When the imageable film is imagewise exposed to the imaging radiation, normally from a scanning laser source, the radiation is absorbed by an energy absorber in the imageable material, and in the ablatable layer if included in the imageable film, which causes transfer of the imageable material from the mask substrate in the areas exposed to the imaging radiation. This process is outlined in U.S. Pat. No. 5,935,758 to Patel, et al., which is hereby incorporated by reference in its entirety. Following exposure to the imaging radiation, the imageable material and other layers of the imaged film remaining on the mask substrate are collectively referred to as the mask image. For example, in one embodiment, the mask image refers to the ablatable layer, the imageable material remaining on the mask substrate. The combination of the mask image and the mask substrate is referred to as the imaged film. The process of forming a mask image is also described in U.S. patent application Ser. No. 11/081,018, which is hereby incorporated by reference in its entirety.

The mask substrate, the imageable material, and optional layers are described further below.

1. Mask Substrate

The mask substrate of the imageable film may be any suitable substrate. Suitable substrates include, for example, plastic sheets and films, such as polyethylene terephthalate or polyethylene naphthalate, fluorene polyester polymers, polyethylene, polypropylene, acrylics, polyvinyl chloride and copolymers thereof, and hydrolyzed and non-hydrolyzed cellulose acetate.

The mask substrate should be sufficiently transparent to the curing radiation. It may be desirable (although not necessary) that the mask substrate be sufficiently transparent to the imaging radiation. In some embodiments, the mask substrate is a transparent polymeric film. An example of a commonly employed mask substrate is a polyethylene terephthalate sheet. Typically, the polyethylene terephthalate sheet is about 20-200 microns thick. One example of a commercially available polyethylene terephthalate sheet is sold under the name MELINEX by DuPont Teijin Films (Hopewell, Va.), such as MELINEX 574.

If necessary, the mask substrate may be surface-treated so as to modify its wettability and adhesion to subsequent layers. Such surface treatments include corona discharge treatment.

The mask substrate may also include an anti-stat coating. The anti-stat coating may be coated on either side of the mask substrate, or it may be located between the layers of a multi-layer mask substrate. An anti-stat coating, also known as a dissipative coating, provides static electric dissipation to the mask substrate, similar to metallized films. One example of a commercially available anti-stat coating is CLEARSTAT anti-stat coating, available from CZ Inks (St. Louis, Mo.). Other suitable anti-stat coatings are known in the art.

2. Subbing Layer

The imageable film may contain a subbing layer, also known as an adhesion promoter, or a scratch resistant hardcoat or hardened gelatin layer, disposed on the mask substrate. The subbing layer provides optical contact after lamination and assists in removing the mask image from the photosensitive material in the areas where the imageable material was removed during imaging. Therefore, suitable subbing layers will not be removed by the imaging radiation with the imageable material when exposed to the imaging radiation. Suitable subbing layers have a high glass transition temperature (Tg), such as, for example, greater than about 90 deg. C. Suitable components for the subbing layer include acrylates such as, for example, hydantoin hexacrylate. These subbing components may be applied with a solvent and then cured with UV or heat to induce crosslinking.

The subbing layer may come pre-coated onto suitable mask substrates. For example, mask substrates coated with subbing layers are commercially available from Courtaulds Performance Films (Martinsville, Va.) and are sometimes referred to as "subbed PET."

Typically, the subbing layer is coated onto the mask substrate to a thickness of 0.1-2.0 microns.

3. Ablatable Layer

The imageable film may also contain an ablatable layer disposed between the mask substrate and the imageable material. An ablatable layer may be particularly suitable when the imaging method includes an ablative mechanism.

Suitable ablatable layers and their preparation are described, for example, in U.S. Pat. Nos. 5,468,591 and 5,576,144 to Pearce, et al., and U.S. Pat. No. 6,369,844 to Neumann, et al. The ablatable layer may include a binder, and more particularly, a "heat-combustible" binder. Suitable heat-combustible binders are reported in U.S. Pat. No. 6,521,390 to Leininbach, et al. By way of example only, suitable heat-combustible binders include poly(alkyl cyanoacrylate) and nitrocellulose. Other suitable heat-combustible polymers, such as glycidyl azide polymer ("GAP"), and other azido group-containing polymers are described in U.S. Pat. No. 5,278,023 to Bills, et al. and U.S. Pat. No. 6,027,849 to Vogel.

The ablatable layer may comprise a particulate material such as metal oxide particles. One suitable particulate material for use in the ablatable layer is an iron oxide particulate available from Toda Kogyco Corp., (Hiroshima, Japan). Particulate materials may provide high optical density with respect to imaging or curing radiation. Metal oxide particulates may be advantageous for an ablative imaging mechanism because they can thermally decompose to generate propulsive gases. Other suitable particulates and metal oxide particulates are reported in U.S. Pub. App. 2001/0026309, for example.

The ablatable layer may optionally include an infrared-absorbing dye. Particularly infrared-absorbing dyes for the ablatable layer are cationic infrared-absorbing dyes reported in U.S. Pat. No. 5,935,758. Other suitable infrared-absorbing dyes are photothermal-bleachable dyes.

The ablatable layer may also comprise a crosslinking agent. The use of a crosslinking agent may impart greater thermal resistance to the ablatable layer. Examples of suitable crosslinking agents include melamine-formaldehyde resins, such as RESIMENE from UCB Group (Belgium), dialdehydes such as glyoxal, phenolics such as DURITE from Borden Chemical Inc. (Columbus, Ohio), polyfunctional aziridines, isocyanates such as DESMODUR AP from Bayer Corp. (Pittsburgh, Pa.), urea-formaldehyde, epoxies such as EPON 1001 from Shell Chemical (Houston, Tex.). Many other suitable crosslinking agents are known in the art.

4. Imageable Material

The imageable material is generally disposed on the mask substrate as a relatively uniform coating (i.e., substantially continuous and having a fairly uniform thickness). In some embodiments, the imageable material, resides on the mask substrate as a single layer. For, example, ablative material and an energy absorber may be combined in one layer. In other embodiments, the imageable material may comprise more than one layer, depending on the chosen imaging method. For example, the imageable material may include an energy absorbing layer, and a layer comprising ablative material adjacent to the energy absorbing layer.

The imageable material includes multiple components such as a colorant (e.g., a dye or pigment) and an energy absorber dispersed in a binder. Other components may also be included in the imageable material.

One component of the imageable material is a colorant. The colorant is selected to absorb or block the curing radiation, such as by reflectance. As used herein, the term "colorant" indicates a component that substantially prevents the transmission of curing radiation through the mask image. The term "colorant" does not indicate that the component necessarily provides or imparts a visible color to the imageable material, although it may do so.

The colorant generally comprises one or more dyes or pigments that will provide the desired spectral properties. It is preferably present in the imageable material in an amount of about 10-50 wt %, based on the solids content of the imageable material.

The colorant can be a particulate material that is of sufficiently small particle size to be dispersed within the imageable material, with or without the aid of a dispersant. Suitable colorants for use in the imageable material include pigments, nonsublimable dyes, or sublimable dyes. Pigments and nonsublimable dyes are suitably employed because they do not tend to migrate. The use of pigment dispersions in imaging is well-known in the art, and any conventional pigments useful for that purpose may be used in the present invention.

In one embodiment of the invention, the colorant is a black dye or pigment. A suitable black dye or pigment absorbs energy at substantially all wavelengths across the visible spectrum, for example, between about 350-750 nm. However, the black dye or pigment may, for example, also absorb in the infrared or ultraviolet region as well. Suitable black dyes or pigments may also include dyes and pigments that absorb different wavelengths within the visible spectrum. These dyes or pigments may, for example, actually be a deep blue or other color. The black dye or pigment may include mixtures of dyes or pigments, or mixtures of both dyes and pigments, that individually may or may not be black but when mixed together provide a neutral black color. For example, a mixture of NEPTUN Black, Blue Shade Magenta, and Red Shade Yellow Pigment, available from BASF (Germany), which provide a neutral black color, may be suitable. DISPERCEL CBJ from Runnemade Dispersions KV (United Kingdom) may also be suitable as the colorant.

One suitable black pigment is carbon black. Carbon black exhibits neutral color and suitable covering power. It may be desirable to use a carbon black having small particles for maximum color strength. Fine-grained carbon black brands with a mean particle size below 30 nm are especially suitable. Examples of suitable carbon black pigments include RAVEN 450, 760 ULTRA, 890, 1020, 1250, and others available from Colombian Chemicals Co. (Atlanta, Ga.), as well as BLACK PEARLS 170, BLACK PEARLS 480, VULCAN XC72, BLACK PEARLS 1100, and others available from Cabot Corp. (Waltham, Mass.). Other suitable carbon blacks include PRINTEX U, PRINTEX L6, SPEZIALSCHWARZ 4 OR SPEZIALSCHWARZ 250 of Degussa (Germany). The carbon black may comprise, for example, about 10-50 wt %, more particularly about 10-40 wt %, and even more particularly about 10-30 wt % of the total solids weight of the imageable material.

Imageable materials containing only carbon black are difficult to formulate due to inherent absorption of infrared radiation by the carbon black particles. Overheating of the carbon black within the imageable material may result in loss of density or increased diffusion of the mask image. Diffusion of the mask image may cause poor edge sharpness of the final imaged article. Incorporating one or more non-infrared absorbing black dyes or pigments in combination with carbon black into the opaque radiation sensitive material reduces the interference with the radiation and improves the quality of the imaged article that results. Even though the concentration of carbon black is reduced significantly, suitable color neutrality and opacity is maintained.

Also suitable as a pigment is a non-carbonaceous particulate material such as metal particles or metal oxide particles.

In another embodiment of the invention, the colorant may be a non-infrared absorbing black dye or pigment. Non-infrared absorbing black dyes or pigments include dyes or pigments that absorb minimal or no amount of infrared radiation. In this embodiment, a mask image is created using an imaging radiation in the infrared region, which is absorbed by a separate infrared absorber. The colorant then would be opaque to (or reflective of) the curing radiation, which is generally ultraviolet radiation. The non-infrared absorbing colorant may absorb some infrared radiation in this embodiment, as long as there is little or no interference with the infrared absorber. For example, non-infrared absorbing black dyes or pigments may absorb less than about 0.5 absorbance unit, more particularly, less than about 0.1 absorbance unit of infrared radiation, at use concentrations.

Non-infrared absorbing black dyes and pigments include, for example, NEPTUN Black X60, PALIOGEN Black S 0084, available from BASF (Germany), as well as MICROLITH Violet B-K, available from Ciba Specialty Chemicals (Tarrytown, N.Y.). Other suitable non-infrared absorbing black dyes may be found in U.S. Pat. No. 6,001,530 to Kidnie, et al. which is incorporated herein by reference in its entirety.

In another embodiment, the imageable material may include an ultraviolet-absorbing dye as a colorant. The dye typically has a strong absorbance in the region of the spectrum to which the photosensitive material is sensitive and which is used as the curing radiation for overall exposure. The ultraviolet-absorbing dye may have an absorbance maximum in the range of about 250 nm and about 600 nm, more typically between about 300 nm and about 500 nm. Examples of such dyes are reported in U.S. Pat. No. 3,769,019 to Weise, et al., U.S. Pat. No. 4,081,278 to Dedinas, et al. and, U.S. Pat. No. 5,399,459 to Simpson, et al. Examples of suitable ultraviolet-absorbing dyes include those marketed under the name UVINUL from BASF (Germany) such as UVINUL 3050, and KEYPLAST YELLOW GC from Keystone Aniline Corporation (Chicago, Ill.).

The imageable material also includes an energy absorber. Excitation of the energy absorber by imaging radiation initiates a transfer of colorant or imageable material, or a physical or chemical change that alters the transparency or opacity of the imaging material to curing radiation. In some embodiments, the colorant acts as the energy absorber, and inclusion of a separate energy absorber is not required. In other words, for these embodiments the colorant serves a dual function. In other embodiments, however, a separate energy absorber is present to sensitize the imageable material to the imaging radiation.

In one embodiment, the energy absorber may include an infrared absorber. The infrared absorber may, for example, convert infrared radiation to heat. The infrared radiation may be, for example, in the range of 750-1200 nm. The generation of heat in the imageable material may then result in a physical or chemical change in the other components of the imageable material, or induce ablation. Examples of suitable infrared absorbers include infrared-absorbing dyes such as cyanine infrared-absorbing dyes, infrared-absorbing pigments such as carbon black, or metals such as aluminum.

In some embodiments, the infrared-absorbing dye is a cationic dye. Cationic dyes produce transparent films when combined with a binder and other components of the imageable material. Suitable cationic dyes for use in the transfer material of the present invention include tetraarylpolymethine (TAPM) dyes, amine cation radical dyes, and mixtures thereof. Preferably, the dyes are the tetraarylpolymethine dyes. Dyes of these classes are typically stable when formulated with the other components of the coating from the imageable film, and absorb in the correct wavelength ranges for use with the commonly available laser sources. Furthermore, dyes of these classes are believed to react with a latent crosslinking agent, described below, when photoexcited by laser radiation.

TAPM dyes comprise a polymethine chain having an odd number of carbon atoms (5 or more), each terminal carbon atom of the chain being linked to two aryl substituents. TAPM dyes generally absorb in the 700-900 nm region, making them suitable for diode laser address. Suitable TAPM dyes are described, for example, in U.S. Pat. No. 5,935,758 to Patel, et al.

Suitable cationic infrared-absorbing dyes include the class of amine cation radical dyes (also known as immonium dyes) reported, for example, in International Publication WO 90/12342, and in EP publication 0 739 748. Suitable cationic infrared-absorbing dyes are also described in U.S. Pat. No. 5,935,758 to Patel, et al.

The infrared-absorbing dye is preferably present in a sufficient quantity to provide a transmission optical density of at least about 0.5, more preferably, at least about 0.75, and most preferably, at least about 1.0, at the exposing wavelength. Typically, this is achieved with about 3-20 wt % infrared-absorbing dye, based on the solids content of the imageable material.

In another embodiment, the energy absorber may include an ultraviolet absorber. The ultraviolet absorber may absorb radiation in the range of about 150-400 nm, for example.

The imageable material also includes a binder. Suitable binders are capable of dissolving or dispersing the other components included in the imageable material. The binder may serve other purposes depending on the mechanism used to image the imageable film.

The total binder is typically present in an amount of about 25-75 wt %, and more suitably in an amount of about 35-65 wt %, based on the solids content of the imageable material.

A wide variety of binders may be suitable in the practice of the invention, with the choice of binder depending on the selected imaging mechanism. The binder should be compatible with the other selected components of the imageable material, and should be soluble in a suitable coating solvent such as lower alcohols, ketones, ethers, hydrocarbons, haloalkanes and the like.

In one embodiment, the binder includes a low-tack adhesive binder. Examples of low-tack adhesive binders include, for example, MACROMELT 6900, available from Henkel Corporation (Minneapolis, Minn.), and some polyamide resins, such as UNI-REZ 5803, available from Arizona Chemical Co. (Jacksonville, Fla.).

If, for example, a laser-induced film transfer ("LIFT") system is employed as an imaging mechanism, the binder may be a polymeric material that contains a plurality of hydroxy groups (i.e., a "hydroxylic polymer"). In this embodiment, preferably, 100% of the binder is a hydroxylic polymer. The hydroxy groups may be alcoholic groups or phenolic groups, or both. Binders comprising predominantly alcoholic groups are suitable. A hydroxylic polymer may be obtained by polymerization or copolymerization of hydroxy-functional monomers such as allyl alcohol and hydroxyalkyl acrylates or methacrylates, or by chemical conversion of preformed polymers, e.g., by hydrolysis of polymers and copolymers of vinyl esters such as vinyl acetate. Polymers with a high degree of hydroxy functionality, such as poly(vinyl alcohol), cellulose, etc., are in principle suitable for use in the invention, but in practice the solubility and other physico-chemical properties are less than ideal for most applications. Derivatives of such polymers, obtained by esterification, etherification, or acetalization of the bulk of the hydroxy groups, generally exhibit superior solubility and film-forming properties, and provided that at least a minor proportion of the hydroxy groups remain unreacted, they are suitable for use in the invention.

One suitable hydroxy-functional polymer for use as the binder is a reaction product formed by reacting poly(vinyl alcohol) with butyraldehyde. Commercial grades of this reaction product typically leave at least 5% of the hydroxy groups unreacted (i.e., free), and are generally in common organic solvents and possess excellent film-forming and pigment-dispersing properties.

A commercially available hydroxylic polymer that is suitable is a polyvinyl butyral polymer available under the trade designation BUTVAR B-76 from Solutia, Inc. (St. Louis, Mo.). This particular polymer has a softening range of about 140° C. to about 200° C. Other hydroxylic binders from the BUTVAR series of polymers may also be used. Polyvinyl butyral polymers available under the trade designations MOWITAL from Kuraray America, Inc. (New York, N.Y.) are also suitable.

Alternatively, a blend of one or more non-crosslinkable binders with one or more hydroxy-functional binders may be used. A non-crosslinkable binder should be compatible with the imaging mechanism used in the present invention such that it does not interfere with the transfer of colorant. That is, it should be nonreactive when exposed to the conditions used during imaging. Suitable non-crosslinkable binders include, for example, polyesters, polyamides, polycarbamates, polyolefins, polystyrenes, polyethers, polyvinyl ethers, polyvinyl esters, polyacrylates, polymethacrylates, and the like. An example of a suitable commercially available non-crosslinkable binder that can be combined with the hydroxylic binders described above in the imageable material includes poly(methyl methacrylate) available under the trade designation ELVACITE from DuPont (Wilmington, Del.).

The imageable material may optionally include a fluorocarbon additive for enhancing transfer of a molten or softened imageable material and production of halftone dots (i.e., pixels) having well-defined, generally continuous, and relatively sharp edges. Under imaging conditions, it is believed that the fluorocarbon additive serves to reduce cohesive forces within the imageable material at the interface between the laser-exposed heated regions and the unexposed regions, and thereby promotes clean "shearing" of the exposed regions in the direction perpendicular to the major surface of the imageable material. This provides improved integrity of the dots with sharper edges, as there is less tendency for "tearing" or other distortion as the exposed regions separate from the rest of the imageable material.

A wide variety of compounds may be employed as the fluorocarbon additive, provided that the chosen additive is substantially involatile under normal coating and drying conditions, and is sufficiently compatible with the binder(s). Thus, highly insoluble fluorocarbons, such as polytetrafluoroethylene and polyvinylidenefluoride, are unsuitable, as are gases and low boiling liquids, such as perfluoralkanes. With the above restrictions, both polymeric and lower molecular weight materials may be used.

Examples of suitable fluorocarbon additives are described in U.S. Pat. No. 5,935,758 to Patel, et al. The imageable material may also include a fluorocarbon compound as described in U.S. Pat. No. 6,664,020 to Warner, et al. Other suitable fluorocarbon compounds are reported in EP publication 0 602 893 and the references cited therein. A preferred fluorocarbon additive is a sulfonamido compound N-ethyl perfluorooctanesulfonamide having the formula ($C_8F_{17}$)

SO$_2$NH(CH$_2$CH$_3$), which includes 70% straight chains and 30% branched chains. The fluorocarbon additive is typically used in an amount of about 1-10 wt %, based on the solids content of the imageable material. Preferably, the weight ratio of fluorocarbon additive to colorant is at least about 1:10, and more preferably at least about 1:5.

A latent crosslinking agent is employed in some embodiments of the imageable material. A latent crosslinking agent may be especially suitable when a LIFT system is employed as the imaging mechanism. As used herein, a "latent crosslinking agent" is a compound that is capable of causing crosslinking only under conditions of laser address. It is believed that during laser imaging, the latent crosslinking agent reacts with a photoexcited infrared absorbing dye, which initiates crosslinking of the hydroxylic binder. Thus, crosslinking occurs during laser imaging.

Suitable latent crosslinking agents include compounds derived from dihydropyridine, for example. Suitable derivatives of dihydropyridine can be substituted at any of the ring positions with appropriate substituents, such as alkyl or aryl groups. In particular, 3,5-dicarboxylic diester derivatives of dihydropyridine are suitable as latent crosslinking agents. Polymers comprising a 3,5-dicarboxylic diester derivative of dihydropyridine integrated into the polymer backbone may also be suitable. Latent crosslinking agents that are useful in the imageable material are described in U.S. Pat. No. 5,935,758 to Patel, et al.

This latent crosslinking agent is present in the imageable material in an amount of up to about 30 wt %, based on the solids content of the imageable material. Alternatively, a latent crosslinking agent can be present in a receptor sheet, as described below.

The latent crosslinking agent is believed to be important for providing cohesion within the transferred imageable material. This complements the action of a fluorocarbon additive, and results in transfer of the exposed imageable material as a coherent piece. It is also believed to be important for preventing retransfer of colorant back to the film, as well as back-transfer of colorant to a separate film, if used in a subsequent imaging step.

Additional components such as, for example, plasticizers, coating aids, dispersing agents, UV absorbers, fillers, etc., may also be incorporated into the imageable material. The various additives are well-known in the art.

Dispersing agents, or "dispersants," may be desirable to achieve optimum dispersion of the various components of the imageable material in the binder. Some examples of dispersing agents include, for example, polyester/polyamine copolymers, alkylarylpolyether alcohols, acrylic binders, and wetting agents. One suitable dispersant in the imageable material is a block copolymer with pigment-affinic groups, which is available under the trade designation DISPERBYK 161 from Byk-Chemie USA (Wallingford, Conn.). The dispersing agent is preferably used in the dispersion in an amount of about 1-6 wt %, based on the solids content of the imageable material.

Surfactants may be used as a coating aid to improve solution stability. A wide variety of surfactants can be used. One suitable surfactant is a fluorocarbon surfactant used in the imageable material to improve coating quality. Suitable fluorocarbon surfactants include fluorinated polymers, such as the fluorinated polymers described in U.S. Pat. No. 5,380,644 to Yonkoski, et al. An example of a suitable coating aid is a NOVEC fluorosurfactant available from 3M (St. Paul, Minn.), such as FC 4432. A suitable quantity of surfactant may be in the range of about 0.05 wt %, and less than about 5 wt %, and typically is in the range of about 1-2 wt %.

5. Receptor Sheet

A receptor sheet may be used in some embodiments of the invention to receive the waste imageable material from the mask substrate. As used herein, the phrase "receptor sheet" refers to a material, generally in sheet-form, having at least one major surface that is capable of receiving the waste imageable material.

The receptor sheet may include a sheet support. The sheet support for the receptor sheet is chosen based on the particular imaging application. Suitable sheet supports include paper or card stock, metals (e.g., steel or aluminum), or films or plates composed of various film-forming polymers. Suitable polymeric materials include addition polymers (e.g., poly(vinylidene chloride), poly(vinyl chloride), poly(vinyl acetate), polystyrene, polyisobutylene polymers and copolymers), and linear condensation polymers (e.g., polyesters such as poly(ethylene terephthalate), poly(hexamethylene adipate), and poly(hexamethylene adipamide/adipate)). The sheet support may be transparent or opaque. Nontransparent sheet supports may be diffusely reflecting or specularly reflecting.

Suitable sheet supports for the receptor sheet include, for example, plastic sheet materials and films, such as polyethylene terephthalate, fluorene polyester polymers, polyethylene, polypropylene, acrylics, polyvinyl chloride and copolymers thereof, and hydrolyzed and non-hydrolyzed cellulose acetate. A particularly suitable support is a polyester film, such as a polyethylene terephthalate sheet. For example, a polyethylene terephthalate sheet sold under the name MELINEX by DuPont Teijin Films (Hopewell, Va.), such as MELINEX 574, is suitable.

In practice, the sheet support is typically about 20-200 microns thick. If necessary, the support may be pretreated so as to modify its wettability and adhesion to subsequently applied coatings. Such surface treatments include corona discharge treatment, and application of subbing layers or releasing layers. The sheet support may also comprise a strippable layer containing an adhesive, such as an acrylic or vinyl acetate adhesive.

Although it is not required, it may be advantageous to include a texturized surface or a coating, or both a texturized surface and a coating on one side of the receptor sheet of the present invention. A texturized surface on the sheet support or the coating may be provided by a plurality of protrusions extending from a major surface of the support or coating. The protrusions can be obtained in a variety of ways. For example, a texturizing material may be included in the coating to form the protrusions, as discussed below. Alternatively, the sheet support may be microreplicated by conventional methods, thereby forming the protrusions. A texturized receptor sheet is reported in U.S. Pat. No. 4,876,235 to DeBoer, for example.

The receptor sheet may also include a coating. The coating may comprise a binder capable of providing a tack-free surface at ambient temperatures, and which is compatible with the material that will be transferred from the imageable film (such as the imageable material or colorant). The coating may contain optional additives such as surfactants, and antioxidants. The coating may also contain a texturizing material.

In choosing a polymeric binder, considerations include, for example, the glass transition temperature, softening point, and viscosity of the polymer, etc. A wide variety of polymeric binders are suitable for the practice of the present invention. The binder may include a hydroxylic polymer (i.e., a polymer having a plurality of hydroxy groups), or may include polymers free from hydroxy groups.

The choice of the polymeric binder for the coating on the receptor sheet may depend on the imaging mechanism (e.g., ablation, or melt-stick). For use in an imaging mechanism employing a melt-stick mechanism, for example, it may be advantageous to employ a similar or identical binder for the receptor sheet as is used as the binder of the imageable material on the imageable film.

For some embodiments, BUTVAR B-76 polyvinyl butyral copolymer from Solutia, Inc. (St. Louis, Mo.) and similar thermoplastic polymers are highly suitable materials for use in the coating on the receptor sheet. Another suitable polymer for use in the coating of the receptor sheet is a polyvinyl pyrrolidone/vinyl acetate copolymer binder available under the trade designation E-735 from International Specialty Products, Inc. (Wayne, N.J.). Another suitable polymer is a styrene-butadiene copolymer available under the trade designation PLIOLITE from Goodyear Chemical (Akron, Ohio). Yet another suitable polymer is a phenoxy resin available under the trade designation INCHEMREZ PKHM-301 from InChem Corp. (Rock Hill, S.C.).

A styrene/allyl alcohol copolymer may also be suitably included in the coating. A commercially available styrene/allyl alcohol copolymer is SAA-100 from Lyondell Chemical Company (Houston, Tex.).

Mixtures of polymers may also be suitably employed as the binder. For example, a mixture of BUTVAR B-76 and SAA-100 in a ratio of about 2:1-20:1 by weight is suitable.

The materials described above are given only as non-limiting examples. Other suitable polymers will be appreciated by those skilled in the art.

The presence of some surface roughness is found to be advantageous when a receptor sheet is brought into proximity with the imageable film for imaging. Protrusions in the receptor sheet regulate precisely the relationship between the imageable film and the receptor element, and provide a generally uniform gap between the imageable and the receptor sheet during imaging. The magnitude of the protrusions on the receptor sheet, whether formed by beads or particulate matter or by texturing, may be measured using known techniques such as interferometry or by examination of the surface using an optical or electron microscope.

As mentioned above, the texturizing material may be an inert particulate material such as, for example, polymeric beads, silica particles, metal oxide particles, inorganic salts, etc. The shape of the beads is preferably spherical, oblong, ovoid, or elliptical. The texturizing material may be of essentially uniform size (i.e., monodisperse), or may vary in size. Dispersions of inorganic particles such as silica generally have a range of particle sizes, whereas monodisperse suspensions of polymer beads are readily available. Whichever type of population is used, the particles should not project above the plane of the surface of the receptor element by more than about 8 microns on average, but should preferably project above said plane by at least about 1 microns, and more preferably at least about 3 microns. In some constructions, it is advantageous to add two distinct sets of beads with different average sizes. This allows the flexibility to balance haze with slip or separation characteristics.

Nonlimiting examples of polymeric beads that may be suitable include poly(methyl methacrylate) and poly(stearyl methacrylate) beads, and beads comprising diol dimethacrylate homopolymers or copolymers. Suitable polymeric beads also include those made from polystyrene, phenol resins, melamine resins, epoxy resins, silicone resins, polyethylene, polypropylene, polyesters, polyimides, etc.

In general, the polymeric beads should have a particle size ranging from about 3-50 microns, preferably from about 5-25 microns. The coverage of the spacer beads in the coating may range from about 5-2,000 beads/mm$^2$. As the particle size of the beads increases, then proportionally fewer beads are required.

By way of example, one suitable texturizing material includes monodisperse beads of poly(methyl methacrylate) having an average diameter of approximately 10 microns. Such beads are commercially available.

The concentration of texturizing material in the coating on the receptor sheet should be sufficient to provide an areal density of about 100-500 particles/mm$^2$. By way of example, a suitable particle areal density is about 200 particles/mm$^2$. In one embodiment, the coating on the receptor sheet comprises about 20-80 parts binder to about 1 part texturizing material, by weight.

As an alternative to the use of beads or particles the receptor element surface may be physically textured to provide the required protrusions. Metal surfaces, such as aluminum, may be textured by graining and anodizing. Other textured surfaces may be obtained by microreplication techniques, as are known in the art.

B. Imaging Mechanisms

Methods of imagewise exposing the imageable film to imaging radiation are conventional in the art. Both analog and digital methods of imagewise exposing the imageable film are suitable. Digital methods are preferred by many users due to the ease of imaging and the increased availability of digital imaging apparatus.

Figure 1A:
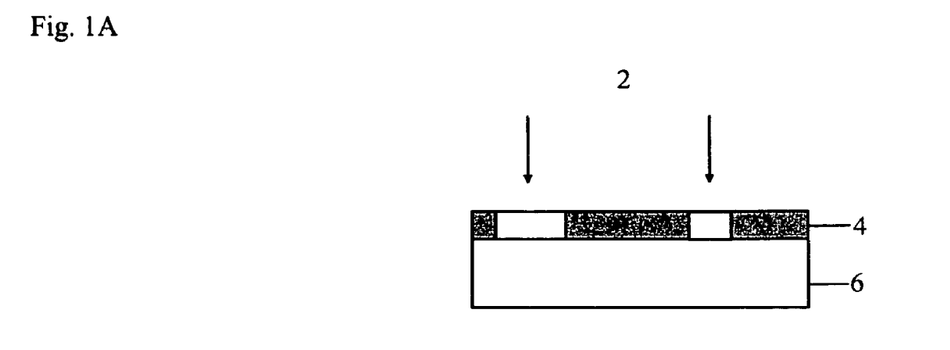

In some embodiments of the invention, imagewise exposure is efficiently accomplished using laser radiation from a laser that is scanned or rasterized under computer control. Any of the known scanning devices may be used, e.g., flat-bed scanners, external drum scanners, or internal drum scanners. In these devices, the imageable film to be imaged is secured to the drum or bed, and the laser beam is focused to a spot that can impinge on the imageable material. The laser spot is scanned over the area to be imaged while the laser output is modulated in accordance with electronically stored image information (i.e., digital data). Two or more lasers may scan different areas of the imageable material simultaneously, to increase throughput. This embodiment is illustrated in FIG. 1A in which radiation 2 is used to produce a mask image 4 on a mask substrate 6.

In certain embodiments the imaging radiation may include infrared radiation. The infrared radiation may be, for example, in the range of about 750-1200 nm. In the practice of this embodiment, suitable imageable materials include an energy absorber that is sensitive to infrared radiation, as described above. This component may, for example, convert infrared radiation to heat. The generation of heat in the imageable material may then result in a physical or chemical change in another component of the imageable material. In this embodiment, the imageable film may be suitably mounted to an infrared imager and exposed imagewise to infrared radiation. Infrared radiation may be provided, for example, by an infrared laser such as a diode laser (830 nm) or a Nd:YAG laser (1064 nm), which may be scanned or rasterized under computer control.

Suitable infrared imagers include those infrared imagers used in proofing processes. Examples of such infrared imagers include DESERTCAT 88, available from ECRM (Tewksbury, Mass.). Infrared imagers for CTP lithographic plate applications, such as TRENDSETTER from Creo (Burnaby, British Columbia) and DIMENSION from Presstek (Hudson, N.H.) may also be used. Imagers configured for imaging flexographic articles with integral masks, such as CYREL Digital Imager (CDI SPARK) manufactured by Esko-Graphics (Kennesaw, Ga.), ThermoFlex by Creo (Burnaby, British Columbia), and OMNISETTER from Misomex International (Hudson, N.H.), could also be employed.

In other embodiments, the imageable material is exposed to visible laser light. The visible light may be, for example, in the range of about 400-750 nm. Commercially available filmsetters and imagesetters can be used. For example ACCUSET Plus (visible red laser diode, 670 nm) from Agfa-Gevaert (Belgium), ADVANTAGE DL3850 (410 nm) from Agfa-Gevaert, LUXEL V-9600 (410 nm) from Fuji Photo Film, DIAMONDSETTER (frequency-doubled Nd:YAG laser; 532 nm) from Western Lithotech (St. Louis, Mo.), SELECTSET 5000 (HeNe, 630 nm) from Agfa-Gevaert.

In still other embodiments, the imageable material is exposed to ultraviolet radiation, by laser direct imaging (LDI). The ultraviolet radiation may be in the range of about 150-410 nm. DP-100 from Orbotech (Billerica, Mass.), and DIGIRITE 2000 from Etec Systems (Tucson, Ariz.) may be suitable for UV laser imaging.

In some embodiments, the mask image residing on the mask substrate may optionally be cured after imaging by subjecting it to heat treatment, provided that transfer property of the mask image is not adversely affected. Heat treatment may be done by a variety of means, such as storage in an oven, hot air treatment, contact with a heated platen or passage through a heated roller device. In other embodiments, heat treatment is not necessary for curing to take place.

The listed imaging mechanisms should be considered as non-limiting examples only, as the imageable film can be readily adapted to work with other imaging mechanisms.

1. Ablation

In one imaging mechanism, the exposed areas of the imageable material are removed through ablation. In this imaging mechanism, the exposed imageable material and ablatable layer if present is propelled from the mask substrate by generation of a gas. In this embodiment, specific binders that decompose upon exposure to heat (such as laser radiation) to rapidly generate a gas may be used in the imageable material or in the ablatable layer. The build-up of gas under or within the exposed areas of the imageable material creates pressure that propels the imageable material off of the mask substrate in the exposed areas. This action is distinguishable from other mass transfer techniques in that a chemical change (e.g., bond-breaking), rather than a physical change (e.g., melting, evaporation or sublimation), causes an almost complete transfer of the imageable material rather than a partial transfer.

In one ablative mode of imaging by the action of a laser beam, an imageable film having a layer of imageable material comprising a colorant, an infrared absorbing dye, and a binder is imaged. Energy provided by the laser drives off the imageable material at the spot where the laser beam impinges the imageable film.

In another embodiment, the binder serves as a "heat-combustible" material as described above, and as further discussed in U.S. Pat. No. 6,521,390 to Leinenbach, et al.

The heat-combustible binder may optionally be present in the ablatable layer for the practice of this embodiment.

With an ablative mechanism, a debris collector, such as, for example, a vacuum or a suitable receptor sheet, may be placed near imageable material to retrieve the exposed imageable material after it is propelled from the mask substrate. Ablation transfer is reported, for example, in U.S. Pat. No. 5,171,650 to Ellis, et al. and in International Publication WO 90/12342.

2. Melt-Stick Transfer

The areas of the imageable material exposed to the imaging radiation may also be removed through melt-stick. In a melt-stick system, the imageable material transfers in a molten or semi-molten state from the mask substrate to a suitable receptor sheet upon exposure to radiation. The molten or semi-molten state is characterized by reduced viscosity, which provides flowability to the imageable material. The imageable material flows across to, and adheres to the surface of a receptor sheet with greater strength than it adheres to the mask substrate. Physical transfer of the imageable material from the mask substrate to the receptor sheet in exposed areas thus results. Following transfer, the mask substrate along with untransferred imageable material and other layers is separated from the receptor sheet to form the mask image on the mask substrate.

In the practice of this embodiment, the receptor sheet and the transferred imageable material are generally (but not necessarily) discarded as waste.

Further aspects and requirements for melt-stick transfer may be found in U.S. Pat. No. 5,819,661 to Lewis, et al. and in U.S. Pat. No. 5,238,778 to Hirai, et al., each of which is incorporated by reference herein.

3. Laser-Induced Film Transfer

The exposed areas of the imageable material may also be removed from the mask substrate through a laser-induced film transfer ("LIFT") mechanism. In this embodiment, the imageable material includes a crosslinking agent which reacts with the binder to form a high molecular weight network in the areas exposed to the imaging radiation. The effect of this crosslinking is better control of melt flow phenomena, transfer of more cohesive material to the receptor, and higher quality edge sharpness of the mask image. Examples of this system may be found in U.S. Pat. No. 5,935,758 to Patel, et al. which is incorporated herein by reference in its entirety.

Suitable imageable material for use with a LIFT mechanism includes a transferable colorant and an infrared-absorbing dye. The colorant is capable of being transferred upon exposure to infrared radiation to a receptor sheet. In another embodiment, the imageable material comprises a binder including a hydroxylic polymer, a transferable colorant, a fluorocarbon additive, a cationic infrared-absorbing dye, and a latent crosslinking agent, which are described above.

4. Peel-Apart

In yet another embodiment, the areas of the imageable material exposed to the imaging radiation are removed from the mask substrate using a suitable receptor sheet in a so-called "peel-apart" mechanism. A peel-apart mechanism depends on the ability to generate differential adhesion properties in the imageable material. After imagewise exposure of the imageable film, the receptor sheet is separated from the mask substrate, and either exposed or unexposed areas of the imageable material remain on the mask substrate.

U.S. Pat. No. 6,013,409 to Chou, incorporated by reference herein in its entirety, describes a suitable peel-apart imaging system. In this embodiment, the imageable material includes a mask substrate, a "photohardenable layer" that includes a colorant, a "photopolymeric adhesive" layer, and an optional releasing layer.

Other embodiments of films suitable for peel-apart imaging are described in references cited at col. 3, line 25 to col. 4, line 16 of U.S. Pat. No. 6,013,409 to Chou, for example.

5. Dye Sublimation or Diffusion

In another embodiment, colorant from the exposed areas of the imageable material is removed through sublimation. Sublimation techniques involve a mechanism wherein the colorant included in the imageable material are sublimed or diffused without simultaneous transfer of the binder. In dye sublimation, a sublimable colorant is converted into gaseous form and dissipated into the atmosphere, or optionally directed towards a suitable receptor sheet.

Dye sublimation is reported, for example, in U.S. Pat. No. 5,126,760 to DeBoer, and U.S. Pat. No. 5,994,026 to DeBoer, et al., each of which is incorporated by reference in its entirety. Thermal dye diffusion transfer as described, for example, in U.S. Pat. No. 5,330,962 to De Braabandere, et al. is also suitable as an imaging method.

Sublimable colorants that can be used include dyes described, for example, in U.S. Pat. Nos. 5,576,141, 5,576, 142, 5,521,050, 5,521,051, and 5,510,228, to Neumann, et al. Generally, such dyes are present in the imageable material in an amount of at least about 25 wt %.

By a dye sublimation mechanism, a mask image may be generated on a carrier sheet using a suitable imageable film, and without the need for a receptor sheet.

In another embodiment, a receptor sheet is employed to capture the sublimed colorant. The mask image comprises the imageable material remaining on the carrier sheet. In the practice of this embodiment, the receptor sheet and the transferred colorant are generally (but not necessarily) discarded as waste.

In another embodiment, the mask image comprises the colorant that is transferred to a receptor sheet. In the practice of this embodiment, the carrier sheet and remaining imageable material are generally discarded as waste.

II. Laminating the Imaged Film to an Imageable Article

Figure 1B:
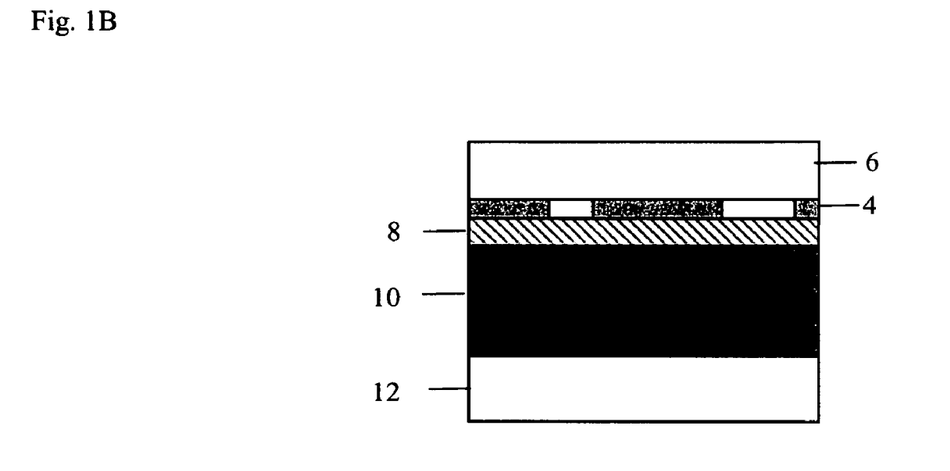

Another step in the method of the present invention includes laminating the imaged film to an imageable article. The step of laminating the imaged film includes placing the mask image in proximity with the releasing layer disposed on the photosensitive material. The result of one embodiment of this step is illustrated in FIG. 1B in which the imaged film formed of a mask image 4 disposed on a mask substrate 6 is shown laminated onto an imageable article formed of a releasing layer 8, a photosensitive material 10, and a photosensitive substrate 12. Various embodiments of the imageable article are discussed below as well as in U.S. patent application Ser. No. 11/081,018 which is hereby incorporated by reference in its entirety.

A. Imageable Article

The imageable article may include a flexographic printing plate precursor, a printed circuit board ("PCB") precursor, or a lithographic printing plate precursor. Each of these articles form relief images as part of becoming a flexographic printing plate, a PCB and a lithographic printing plate, respectively. Although the relief formed on a lithographic printing plate is generally only a few microns, a lithographic printing plate is nonetheless one of the products that may be formed utilizing the method of the present invention.

The imageable article includes at least a photosensitive material. The photosensitive material may either be positive working or negative working. A negative working photosensitive material is hardenable or curable by exposure to a curing radiation and generally includes a polymer or prepolymer that polymerizes or crosslinks upon exposure to the curing radiation. The imageable article may also include a suitable photosensitive substrate upon which the photosensitive material is coated.

Furthermore, optional components, such as a releasing layer, a cover sheet, or a metal layer may be included in the imageable article. The presence of a releasing layer facilitates removal of the imaged film from the photosensitive material in a subsequent step of the method. The releasing layer may also provide sufficient adhesion between the imaged film and the imageable article during the curing step. The releasing layer should not significantly absorb or scatter the curing radiation. At room temperatures the releasing layer allows in-tact removal of the mask image but doesn't allow for in-tact removal at high temperatures.

The releasing layer may also protect the ultraviolet-curable resin from fingerprinting or other damage, and may be disposed between the ultraviolet curable resin and the cover sheet. This layer is sometimes referred to in the art as an anti-tack layer, a separation layer, slip layer, or protective layer. By way of example only, coatings suitable as a releasing layer include poly(vinyl alcohol) or similar polymers, a cellulosic polymer such as methylcellulose or hydroxypropyl methylcellulose, or polyvinyl butyral or other hydroxylic polymer as described above. One particular example of the releasing layer is a hydrolized styrene maleic anhydride copolymer. The releasing layer may also be formed of silicone.

The releasing layer may include polyamide, such as for example, MACROMELT 6900, available from Henkel Corporation (Minneapolis, Minn.), polyvinyl alcohol, copolymers of ethylene and vinyl acetate, amphoteric interpolymers, cellulosic polymers, such as hydroxyalkyl cellulose, and cellulose acetate butyrate, polybutyral, cyclic rubbers, and combinations thereof. Amphoteric interpolymers are described in U.S. Pat. No. 4,293,635 to Flint, et al. which is hereby incorporated by reference.

A transparent and thin releasing layer may be beneficial to obtain a higher resolution image. The releasing layer thickness may range from about 0.1-10 micron, for example. A thin releasing layer may be advantageous, as a thin layer does not adversely affect the resolution that is obtainable for the resulting relief image. A thin releasing layer may also be easier to remove during subsequent processing steps.

The releasing layer may contain coating aids, surfactants, release-enhancing materials, etc. For example, the releasing layer may contain a suitable surfactant such as SURFYNOL 465 (ethoxylated tetramethyl decynediol) or SURFYNOL GA (acetylenic diols compounded with other non-ionic surfactants and solvents) from Air Products (Allentown, Pa.), SURFACTOL 365 (ethoxylated castor oil), from CasChem Inc. (Bayonne, N.J.) or Triton X-100 (octylphenoxypolyethoxyethanol) from Rohm & Haas (Philadelphia, Pa.).

In some embodiments, the photosensitive material is disposed on a photosensitive substrate. Ideally the photosensitive substrate is made from a dimensionally stable material, such as polyester film or an aluminum sheet. The ultraviolet-curable resin may also include an elastomeric binder, at least one monomer and a photoinitiator, where the initiator has a sensitivity to non-infrared radiation. In most cases, the initiator will be sensitive to ultraviolet or visible radiation or both. Examples of suitable initiator compositions have been reported in U.S. Pat. No. 4,323,637 to Chen, et al., U.S. Pat. No. 4,427,749 to Gruetzmacher, et al., and U.S. Pat. No. 4,894,315 to Feinberg, et al.

The elastomeric binder may be a single polymer or mixture of polymers which may be soluble, swellable or dispersible in aqueous, semi-aqueous or organic solvent developers. Suitable binders include those described in U.S. Pat. No. 3,458,311 to Alles, U.S. Pat. No. 4,442,302 to Pohl, U.S. Pat. No. 4,361,640 to Pine, U.S. Pat. No. 3,794,494 to Inoue, et al., U.S. Pat. No. 4,177,074 to Proskow, U.S. Pat. No. 4,431,723 to Proskow, and U.S. Pat. No. 4,517,279 to Worns. Binders which are soluble, swellable or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers and other copolymers. The block copolymers discussed in U.S. Pat. No. 4,323,636 to Chen, U.S. Pat. No. 4,430,417 to Heinz, et al., and U.S. Pat. No. 4,045,231 to Toda, et al. may be used. The binder may comprise at least about 65 wt % of the ultraviolet-curable resin. The term binder, as used herein, encompasses core-shell microgels and blends of microgels and preformed macromolecular polymers, such as those described in U.S. Pat. No. 4,956,252 to Fryd, et al.

The ultraviolet-curable resin may also contain a single monomer or mixture of monomers which must be compatible with the binder to the extent that a clear, non-cloudy photosensitive layer is produced. Monomers that may be used in the ultraviolet-curable resin are well known in the art and include, but are not limited to, addition-polymerization ethylenically unsaturated compounds having relatively low molecular weights (generally less than about 30,000 Da). Suitable monomers have a relatively low molecular weight, less than about 5000 Da. Unless described otherwise, throughout the specification molecular weight is the weight-average molecular weight. Examples of suitable monomers include, but are not limited to, t-butyl acrylate, lauryl acrylate, the acrylate and methacrylate mono- and polyesters of alcohols and polyols such as alkanols, e.g., 1,4-butanediol diacrylate, 2,2,4-trimethyl-1,3 pentanediol dimethacrylate, and 2,2-dimethylolpropane diacrylate, alkylene glycols, e.g., tripropylene glycol diacrylate, butylene glycol dimethacrylate, hexamethylene glycol diacrylate, and hexamethylene glycol dimethacrylate, trimethylol propane, ethoxylated trimethylol propane, pentaerythritol, e.g., pentaerythritol triacrylate, dipentaerythritol, and the like. Other examples of suitable monomers include acrylate and methacrylate derivatives of isocyanates, esters, epoxides and the like, such as decamethylene glycol diacrylate, 2,2-di(p-hydroxyphenyl)propane diacrylate, 2,2-di(p-hydroxyphenyl)propane dimethacrylate, polyoxyethyl-2,2-di(p-hydroxyphenyl)propane dimethacrylate, and 1-phenyl ethylene-1,2-dimethacrylate. Further examples of monomers can be found in, U.S. Pat. No. 4,323,636 to Chen, U.S. Pat. No. 4,753,865 to Fryd, et al., U.S. Pat. No. 4,726,877 to Fryd, et al., and U.S. Pat. No. 4,894,315 to Feinberg, et al. The monomer may comprise at least 5 wt % of the ultraviolet-curable resin.

The photoinitiator may be any single compound or combination of compounds which is sensitive to ultraviolet radiation, generating free radicals which initiate the polymerization of the monomer or monomers without excessive termination. The photoinitiator should be sensitive to visible or ultraviolet radiation. The photoinitiator may also be insensitive to infrared and/or visible radiation and should be thermally inactive at and below 185° C. Examples of suitable photoinitiators include the substituted and unsubstituted polynuclear quinones. Examples of suitable systems have been disclosed in, U.S. Pat. No. 4,460,675 to Gruetzmacher and U.S. Pat. No. 4,894,315 to Feinberg, et al. Photoinitiators are generally present in amounts from about 0.001-10.0 wt % of the ultraviolet-curable resin.

The ultraviolet-curable resin may contain other additives depending on the final properties desired. Such additives include sensitizers, plasticizers, rheology modifiers, thermal polymerization inhibitors, tackifiers, colorants, antioxidants, antiozonants, or fillers.

Plasticizers may be used to adjust the film-forming properties of the elastomer. Examples of suitable plasticizers include aliphatic hydrocarbon oils, e.g., naphthenic and paraffinic oils, liquid polydienes, e.g., liquid polybutadiene, liquid polyisoprene. Generally, plasticizers are liquids having molecular weights of less than about 5,000 Da, but can have molecular weights up to about 30,000 Da. Plasticizers having low molecular weight will encompass molecular weights less than about 30,000 Da.

The thickness of the ultraviolet-curable resin may vary depending upon the type of printing plate desired. In one embodiment, the ultraviolet-curable resin may be, for example, from about 20-250 mils (500-6400 microns) or greater in thickness, more particularly from about 20-100 mils (500-2500 microns) in thickness.

In one embodiment the photosensitive material is part of a flexographic printing plate precursor that includes a suitable ultraviolet-curable resin. The materials that are used to make flexographic printing plates typically include a photosensitive substrate, and one or more photosensitive layers comprising a photosensitive material that includes a polymer or prepolymer. Examples of commercially available flexographic printing plate precursors include, for example, FLEXCEL, available from Kodak Polychrome Graphics (Norwalk, Conn.), CYREL Flexographic plate, available from DuPont (Wilmington, Del.), NYLOFLEX FAR 284, available from BASF (Germany), FLEXILIGHT CBU available from Polyfibron, and ASAHI AFP XDI.

In another embodiment, the photosensitive material is positive working photosensitive composition. In this embodiment, the photosensitive material becomes more removable upon exposure to radiation. Examples of this type of material can be found in U.S. Pat. No. 4,731,319 to Kohara et al. and U.S. Pat. No. 3,634,086 to Lawson et al., particularly the photosensitive composition described in Example 3 of Lawson et al. A commercial example of a positive working photosensitive composition is $AZ_R$ 9200 Photoresist, available from Clairant Corporation (Somerville, N.J.).

In another embodiment, the imageable article may be a precursor to a printed circuit board ("PCB"). In a PCB, a conducting layer (also referred to as a printed circuit) is formed on a photosensitive substrate in the pattern dictated by the mask image. The printed circuit may then direct electrical voltages and currents between various electrical components, such as resistors, capacitors, integrated circuits and other electronic devices. The electrical components are soldered onto the printed circuit at a stage after the formation of the printed circuit.

Suitable PCB precursors may contain a photosensitive substrate, a metal layer and the photosensitive material. The photosensitive substrate may be polyimide film, glass-filled epoxy or phenol-formaldehyde or any other insulating materials known and used in the industry, and of any thickness deemed necessary.

The metal layer covering the photosensitive substrate may include a conductive metal. One suitable example is copper, although any other suitable metal or alloy of metals may be used.

The photosensitive material may include an ultraviolet-curable resin. One example of a suitable ultraviolet-curable resin for use on a PCB precursor includes oligomers and monomers, photoinitiators, and a binder.

Suitable oligomers and monomers include those that may be cross-linked, in the presence of a photoinitiator, upon exposure to ultraviolet radiation. The oligomers and monomers may include those described above. These components may comprise between about 35-75 wt % of the ultraviolet-curable resin.

Photoinitiators should be capable of generating and promoting free radicals that will assist in cross-linking the oligomers and monomers upon exposure to ultraviolet radiation. Suitable photoinitiators are described above. The photoinitiator may comprise up to about 10% of the weight of the oligomers and monomers included in the ultraviolet-curable radiation.

The binder should be soluble in water or dilute alkali developers and well as organic developers. The binder should also be soluble in etching agents, such as aqueous ferric chloride solution. Examples of suitable binders include, for example, novolaks (functionally substituted phenol-formaldehyde resins), styrene maleic anhydride copolymers, polyvinyl methyl ether/maleic anhydride copolymer and its esters, hydroxy propyl cellulose and esterified rosin-maleic esters.

Other components, such as fillers and wetting agents, as well as dyes or pigments to aid visual examination may also be included in the ultraviolet-curable resin used in forming a PCB precursor.

The coating thickness of the ultraviolet-curable resin in the PCB precursor may be between about 3-30 microns, more particularly 12 microns, in order to obtain maximal difference in solubility between cured and uncured regions and optimal adhesion properties.

The photosensitive material used in the PCB precursor construction may also be positive working, meaning that the photosensitive material becomes more developable upon exposure to ultraviolet or visible radiation. In these PCB precursors, the areas of the photosensitive material that are not exposed to radiation will remain on the PCB precursor after developing and are known in the art.

B. Methods of Laminating

In some embodiments, lamination of the imaged film to the imageable article may be accomplished by applying pressure to the imaged film and the imageable article. In other embodiments, the imaged film may be laminated to the imageable article by application of heat. Laminating may also include applying both pressure and heat.

Commercially available laminators which provide both heat and pressure may be used. Suitable laminators include, for example KODAK model 800XL APPROVAL LAMINATOR, available from Eastman Kodak Co. (Rochester, N.Y.), CODOR LPP650 LAMINATOR from CODOR laminating system, (Amsterdam, Holland), and LEDCO HD laminators, available from Filmsource (Casselbury, Fla.). One method of laminating the mask image to the photosensitive material is to place the imageable article on the entrance tray of the laminator. The cover sheet, if present, is removed from the imageable article. The imaged film is placed on the imageable article, with the mask image in proximity with the photosensitive material, or the releasing layer if present, to form an assembly. The assembly is fed into the laminator at the desired speed, temperature and pressure.

III Exposing the Imageable Article Through the Imaged Film

Figure 1C:
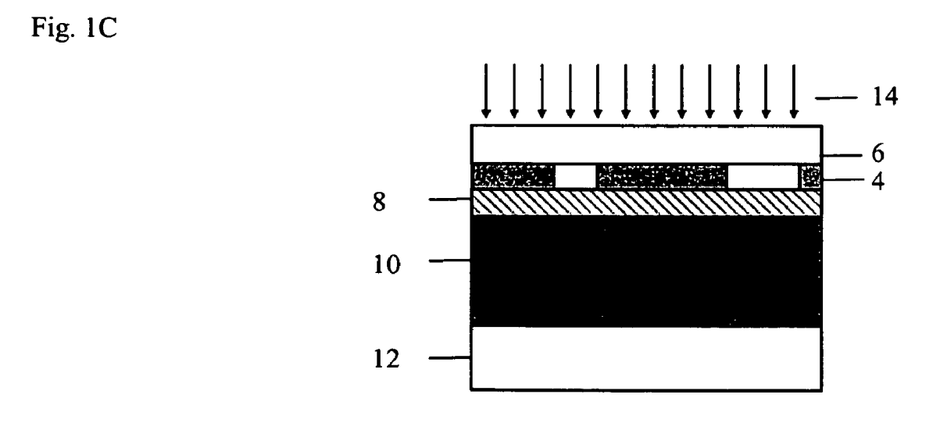

Another step of the invention includes exposing the imageable article to a curing radiation through the imaged film without vacuum pressure. In this step, the curing radiation is projected onto the photosensitive material through the mask image, so that some of the radiation is preferentially blocked by the mask image. In unmasked areas, curing radiation will impinge upon the photosensitive material to cause hardening or curing. The mask image should therefore be substantially opaque to the curing radiation. The term "substantially opaque" means that the mask image should have a transmission optical density of about 2.0 or greater, more particularly about 3.0 or greater in the wavelength of the curing radiation. The unmasked areas and the mask substrate should be substantially transparent. The term "substantially transparent" means that the unmasked areas of the photosensitive material should have a transmission optical density of about 0.5 or less, more particularly about 0.1 or less, even more particularly about 0.05 or less in the wavelength of the curing radiation. The transmission optical density may be measured using a suitable filter on a densitometer, such as, for example a MACBETH TR 927. Generally the step of exposing the photosensitive material through the mask image is done by floodwise exposure since the mask image blocks the curing radiation. This step is illustrated in FIG. 1C. The imageable article including the releasing layer 8, the photosensitive material 10, and the photosensitive substrate 12, is exposed to the curing radiation 14 through the mask image 4 and the mask substrate 6.

Vacuum draw-down is not required during a performance of this step. At least two benefits can be realized if a vacuum draw-down is not used. First, the exposure without vacuum eliminates the time that is required to create the vacuum during exposure, thus increasing throughput of relief images with the present method. Second, the matting agents, or beads, that are typically part of the masks used in the analog method are not required in the mask image used in the present method. Although matting agents improve the vacuum draw-down, the curing radiation is more susceptible to scattering as hits the matting agents. By exposing the photosensitive material to a curing radiation without vacuum draw-down by the method of the present invention, the matting agents are not required and the curing radiation will scatter less than if an analog method were used.

In the manufacture of a flexographic printing plate from the precursor using the method of the present invention, one side of the photosensitive material is first exposed to curing radiation through the support (known as "back-exposure") to prepare a thin, uniform cured layer on the support side of the photosensitive layer. The imageable article is then exposed to curing radiation through the imaged film, thereby causing the photosensitive material to harden or cure in unmasked areas. Unexposed and uncured portions of the photosensitive material are then removed by a developing process, described below, leaving the cured portions which define the relief printing surface.

The wavelength or range of wavelengths suitable as the curing radiation will be dictated by the nature of the photosensitive material. In some embodiments, the curing radiation is ultraviolet radiation. Sources of radiation for flood-wise exposure to ultraviolet radiation are conventional. Examples of suitable visible or UV sources include carbon arcs, mercury-vapor arcs, fluorescent lamps, electron flash units, and photographic flood lamps. Suitable sources of LV radiation include mercury-vapor lamps, particularly sun lamps.

One example of a suitable standard radiation source is the SYLVANIA 350 BLACKLIGHT fluorescent lamp (FR 48T12/350 VL/VHO/180, 115 w) which has a central wavelength of emission around 354 nm. Another example is the BURGESS EXPOSURE FRAME, Model 5K-3343VSII with ADDALUX 754-18017 lamp, available from Burgess Industries, Inc. (Plymouth, Minn.).

Other suitable ultraviolet radiation sources include platemakers which are able to both expose the imageable article to the curing radiation and develop the imageable article after radiation exposure. Examples of suitable platemakers include KELLEIGH MODEL 310 PLATEMAKER available from the Kelleigh Corporation (Trenton, N.J.) and the GPP500F PLATE PROCESSOR, available from Global Asia Limited (Hong Kong).

The time for exposure through the mask image will depend upon the nature and thickness of the photosensitive material and the source of radiation. For example, in one embodiment a FLEXCEL-SRH plate precursor, available from Kodak Polychrome Graphics (Norwalk, Conn.) may be mounted on a KELLEIGH MODEL 310 PLATEMAKER available from the Kelleigh Corporation (Trenton, N.J.) and back-exposed to UV-A radiation through the support for 35 seconds to prepare a thin, uniform cured layer on the support side of the photosensitive layer. The imaged film may then be transferred to the separation layer of the FLEXEL-SRH plate precursor, and the assembly may then be exposed to UV-A radiation through the mask image for 14 minutes.

IV. Removing the Imaged Film from the Imageable Article

Another step of the inventive method involves removing imaged film from the imageable article so that the imaged film is reusable. For the purposes of the present application, the term "reusable" means that the imaged film, particularly the mask image, remains sufficiently in-tact so that the imaged film may be used to produce substantially the same relief image onto another imageable article.

Figure 1D:
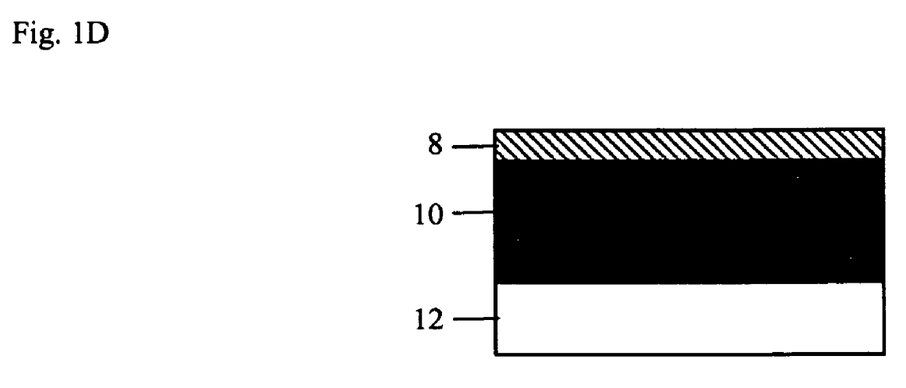

The result of this step is illustrated in FIG. 1D. As illustrated, after removal of the imaged film, the releasing layer 8 remains on the photosensitive material 10 without the mask image 4 illustrated in previous steps.

Removing the imaged film may be done, for example, by peeling the imaged film from the imageable article. Since the mask may be reused on a subsequent photosensitive material, care should be taken when peeling the mask image so that it is not distorted. Removing the imaged film may be done manually, or it may be done mechanically.

V. Developing the Imageable Article

Figure 1E:
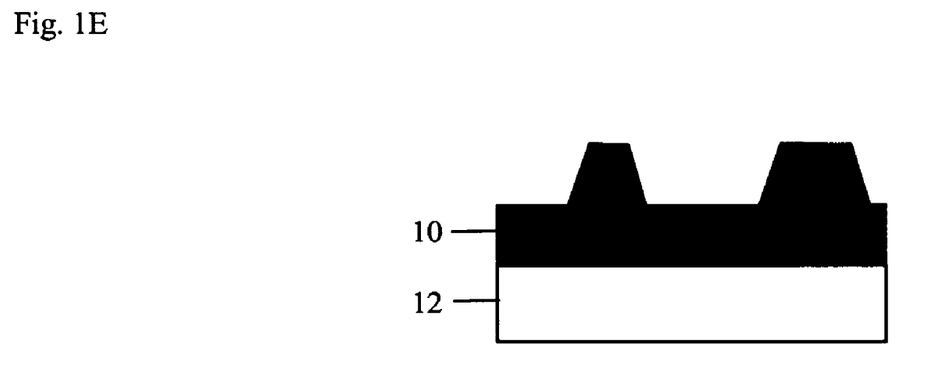

Another step of the invention includes developing the imageable article to form a relief image. Developing the imageable article serves to remove the uncured portions of the photosensitive material and the releasing layer, leaving the cured portions of the imageable material which define the relief image. in the wavelength of the curing radiation. As illustrated in FIG. 1E, developing the imaged article serves to remove the releasing layer 8 and the uncured portions of the photosensitive material 10, leaving the cured portions which define the relief image 10 on the photosensitive substrate 12.

In one embodiment, the step of developing includes washing the imageable article with a suitable developer. Suitable developers may dissolve, disperse, or swell the unexposed areas of the photosensitive material. Development may be carried out at about room temperature. Suitable developers include organic solutions, water, aqueous or semi-aqueous solutions. If water is used, it may contain a surfactant. The developer should be selected based upon the chemical nature of the photosensitive material. Suitable organic solution developers include aromatic or aliphatic hydrocarbons and aliphatic or aromatic halohydrocarbon solutions, or mixtures of such solutions with suitable alcohols. Other organic solution developers have been disclosed in published German Application 38 28 551 and in U.S. Pat. No. 5,354,645 to Schober et al. Suitable semi-aqueous developers may contain water and a water miscible organic solution and an alkaline material. Suitable aqueous developers usually contain water and an alkaline material. Other suitable aqueous developer combinations are described in U.S. Pat. No. 3,796,602 to Briney, et al. One suitable commercially available developer is CYREL OPTISOL ROTARY PLATE WASHOUT SOLUTION, available from DuPont Corporation (Wilmington, Del.).

Mechanical development may also be suitable. Mechanical means for development may include scrubbing or brushing the imageable article to remove the uncured portions of the photosensitive material. Employing mechanical means in combination with solvent development is commonly practiced.

Thermal methods of development are also suitable. One thermal method is reported, for example, in U.S. Published Application 2004/0048199 to Schadebrodt, et al. and the references discussed therein. Another thermal method, in which an absorbent layer is used to absorb the non-cured areas of the photosensitive material is reported in U.S. Pat. No. 5,175,072 to Martens, which is hereby incorporated by reference. Other methods of thermal development may also be suitable.

Post-development processing of the relief image may be suitable in some circumstances. Typical post-development processing includes drying of the relief image to remove any excess solvent, and post-curing the photosensitive material (such as by further exposing the relief image to curing radiation) to cause further hardening or crosslinking of the photosensitive material. Such post-development processing will be familiar to those skilled in the art.

For example, the relief image may be blotted or wiped dry, and then dried in a forced air or infrared oven. Drying times and temperatures may vary. Suitable temperatures for oven drying may include, for example, about 60° C.

Flexographic printing plates may be post-exposed to ensure that the photopolymerization process is complete and that the plate will remain stable during printing and storage. This post-exposure step utilizes the same radiation source as the exposure step described above.

Detackification (which can also be referred to as "light finishing") may also be used if the surface is still tacky. Tackiness can be eliminated by methods known in the art, such as, for example, treatment with bromine or chlorine solutions. Such treatments have been reported in, for example, U.S. Pat. No. 4,400,459 to Gruetzmacher, U.S. Pat. No. 4,400,460 to Fickes et al., and German Patent 28 23 300. Detackification may also be accomplished by exposure to ultraviolet-visible radiation.

The resulting relief image may have a depth from about 2-40% of the original thickness of the photosensitive material. Thus, if the thickness of the uncured photosensitive material is 1500 microns, the depth of the relief image may be about 500 microns. For a flexographic printing plate, the depth may be about 150-500 microns. For a PCB, the photosensitive material is completely removed, in either the exposed or unexposed areas, to reveal the metal layer beneath the photosensitive material. Thus, in a PCB, the depth of the relief depends upon the thickness of the photosensitive material disposed on the metal layer. The depth of the relief is the difference in thickness of the cured photosensitive material in the raised areas (also known as "image areas") of the plate, and the thickness of the cured photosensitive material in the valleys of the plate where the photosensitive material was developed.

VI. Reusing the Imaged Film

Once removed from the imageable article, the imaged film may then be reused to form additional relief images on other imageable articles. The steps of transferring the imaged film to a second imageable article, exposing the second imageable article to the curing radiation through the imaged film, removing the imaged film from the second imageable article and developing the second imageable article may be performed using the same imaged film. These steps may then be repeated with further imageable articles. The number of times that the imaged film may be reused depends upon the type of film and the skill used in removing the imaged film from the imageable article. In most instances, the imaged film may be used to make a relief image less than 10 times, more particularly about 5 times.

This invention may take on various modifications and alterations without departing from the spirit and scope thereof. It is to be understood that this invention may be suitably practiced in the absence of any element not specifically disclosed herein. In describing preferred embodiments of the invention, specific terminology is used for the sake of clarity. The invention, however, is not intended to be limited to the specific terms so selected, and it is to be understood that each term so selected includes all technical equivalents that operate similarly.

EXAMPLES

BUTVAR B-76—polyvinyl butyral resin, available from Solutia, Inc. (St. Louis, Mo.)
EPOLIGHT 1178—an infrared dye that absorbs at 1073 nm, available from Epolin, Inc. (Newark, N.J.)
PC 364—Infrared dye with the following structure SANTICIZER 160—a butyl benzyl polymer, available from Ferro Corporation (Walton Hills, Ohio)
Sudan Black—a blue-black dye solution, available from Lightning Powder Company, Inc. (Salem, Oreg.)
TRUMP dye—an infrared absorbing dye with an absorption maximum at 830 nm with the following structure Trump Dye UVINUL 3050—a UV absorber, 2,2',4,4'-Tetrahydroxybenzophenone, available from BASF (Germany)

Example 1

A 7 mil thick polyester photosensitive substrate coated with a scratch resistant hardcoat, available from Courtaulds Performance Films (Martinsville, Va.), was coated with an ablatable layer solution containing the components listed in Table 1 as a 5% total solids solution in a 4.5:1 solvent mix of acetone and cyclohexanone using a #7 coating rod. The ablatable layer solution was dried for 5 minutes at 190° F. to form an ablatable layer having a coating weight of 50 mg/ft$^2$ on the hardcoat.

TABLE 1

Components of the ablatable layer solution in Example 1

| Component | Percent of total solids |
|---|---|
| polycyanoacrylate | 80.5% |
| EPOLIGHT 1178 | 16.5% |
| PC 364 | 3.0% |

An imageable material solution of the components listed in Table 2 was mixed as a 7.5% total solids solution in a 2:1 solvent mix of methyl isobutyl ketone and ethyl alcohol and applied to the ablatable layer using a #20 coating rod. The imageable material solution was heated in an 180° F. oven for 3 minutes to form a layer of imageable material having a coating weight of 175 mg/ft$^2$ on the ablatable layer.

TABLE 2

Components and amounts of the imageable material solution in Example 1

| Component | Percent of total solids |
|---|---|
| SUDAN Black | 7.8% |
| UVINUL 3050 | 10.0% |
| curcumin | 20.0% |
| nitrocellulose | 29.4% |
| BUTVAR B-76 | 10.4% |
| EPOLIGHT 1178 | 12.5% |
| SANTICIZER 160 | 4.6% |
| TRUMP dye | 5.3% |

The layer of imageable material was imaged with a halftone test pattern at 150 linescreen using round dots at 2540 dpi using a SPARK laser thermal imager, available from Esko-Graphics (Kennesaw, Ga.), emitting 1170 nm radiation in the ablation mode at an energy level of 0.8 J/cm$^2$ to form an imaged film. A $D_{min}$ of 0.01 above the base film and sharp halftone dots were visually observed.

A FLEXCEL-SRH flexographic precursor (the "precursor"), available from Kodak Polychrome Graphics (Norwalk, Conn.), containing a photosensitive substrate, a photosensitive material, a releasing layer, and a cover sheet, was back-exposed with UV radiation through the photosensitive substrate on a KELLEIGH MODEL 310 PLATEMAKER available from the Kelleigh Corporation (Trenton, N.J.) for 31 seconds, and the cover sheet was peeled from the precursor. The imaged film was laminated to the precursor by placing the precursor in the entrance to an AGL hot roll laminator, available from Advanced Grieg Laminators (AGL) (Madison, Wis.) and placing the article on the precursor with the imaged layer of imageable material facing the releasing layer of the precursor. The precursor and imaged film were then laminated together at a nip pressure of 40 psi and a roller surface temperature of about 260° F. The laminator speed was set at 30 inches/minute (76.2 cm/minute).

The imaged film laminated to the precursor was placed on the KELLEIGH MODEL 310 PLATEMAKER available from the Kelleigh Corporation (Trenton, N.J.) with the imaged film facing the source of the radiation. Without using a vacuum draw-down, the assembly was exposed to UV radiation for 13 minutes.

Following exposure, the imaged film was removed by manually peeling the imaged film from the exposed precursor. No damage to the mask was observed.

The exposed precursor was then developed for 20 minutes using OPTISOL solution to form a relief image. After development, the relief image was dried in a 140° F. oven for 2 hours and then placed back on the KELLEIGH MODEL 310 PLATEMAKER for light finishing with UV-C radiation for 8 minutes. Finally, the relief image was post-exposed with UV-A radiation for 10 minutes.

Example 2

A sheet of Kodak Direct Image Thermal Recording Film 1401, available from Eastman Kodak (Rochester, N.Y.) was imaged with a halftone test pattern at 150 linescreen using round dots at 2400 dpi [above film was at 2540 dpi] using a DESERTCAT DC88 laser thermal imager, available from ECRM (Tewksbury, Mass.) emitting 830 nm radiation in the ablation mode at an energy level of 0.5 J/cm² to form an imaged film.

A first FLEXCEL-SRH flexographic precursor (the "precursor"), available from Kodak Polychrome Graphics (Norwalk, Conn.), containing a photosensitive substrate, a photosensitive material, a releasing layer, and a cover sheet, was back-exposed with UV radiation through the photosensitive substrate on a KELLEIGH MODEL 310 PLATEMAKER available from the Kelleigh Corporation (Trenton, N.J.) for 31 seconds, and the cover sheet was peeled from the precursor. The imaged film was laminated to the precursor by placing the precursor in the entrance to an AGL hot roll laminator, available from Advanced Grieg Laminators (AGL) (Madison, Wis.) and placing the imaged film on the precursor with the imaged layer of imageable material facing the releasing layer of the precursor. The precursor and imaged film were then laminated together at a nip pressure of 40 psi and a roller surface temperature of about 260° F. The laminator speed was set at 30 inches/minute (76.2 cm/minute).

The imaged film laminated to the precursor was placed on the KELLEIGH MODEL 310 PLATEMAKER available from the Kelleigh Corporation (Trenton, N.J.) with the imaged film facing the source of the radiation. Without using a vacuum draw-down, the assembly was exposed to UV radiation for 13 minutes.

Following exposure, the imaged film was removed by manually peeling the imaged film from the exposed precursor. The precursor was then developed, dried and finished as recommended by the manufacturer to form a first finished plate. Flexographic dots from 1% to 99% were observed on the first finished plate. The finished plate was then used to print on a Mark-Andy 2200 flexo press.

The imaged film was then re-laminated to a second FLEXCEL-SRH flexographic precursor, exposed and processed in the same manner as the first FLEXCEL-SRH flexographic precursor to form a second finished plate. The image quality of the second finished plate was visually identical to the image quality of the first finished plate.

Example 3 (Comparatives)

The imaged film used in Example 2 was placed on, but not laminated to, a third FLEXCEL-SRH flexographic precursor. The imaged film and the third precursor were then exposed in the same manner as in Example 2 except that the step of exposing the assembly of the imaged film and the third precursor was performed under vacuum draw-down pressure. Finally, the imaged film was removed from the third precursor and the third precursor was processed in the same manner as in Example 2 to form a finished plate. The halftone dot areas of the third finished plate exhibited mottle and loss of shadow detail indicating that the present invention may result in an image with greater resolution than a method that employs vacuum draw-down pressure during exposure.

The imaged film was then placed on a fourth FLEXCEL-SRH flexographic precursor which had the releasing layer removed. The imaged film and fourth flexographic precursor were exposed in the same manner in Example 2 except that the step of exposing the assembly of the imaged film and the third precursor was performed under vacuum draw-down. However, in this example, the imaged film did not peel from the fourth flexographic precursor indicating that the release layer improves the ability to remove the imaged film from the flexographic precursor.

Example 4 (Comparative)

A sample of imaged Kodak Premier PRD7 film, available from Eastman Kodak Co. (Rochester, N.Y.), was laminated to a fifth FLEXCEL-SRH flexographic precursor and exposed in the same manner in Example 2 except that the step of exposing the assembly of the imaged film and the fifth precursor was performed under vacuum draw-down pressure. The imaged Kodak Premier PRD7 film did not peel from the fifth flexographic precursor so that the imaged film could be reused.

The invention claimed is:
1. A method of making a relief image, the method comprising the steps of:
 (a) imagewise exposing an imageable film comprising a mask substrate and an imageable material to imaging radiation to form an imaged film comprising a mask image on the mask substrate;
 (b) laminating the imaged film to an imageable article comprising a releasing layer disposed on a photosensitive material;

(c) exposing the imageable article without vacuum draw-down to curing radiation through the imaged film;
(d) removing the imaged film from the imageable article so that the imaged film is reusable; and
(e) developing the imageable article to form the relief image.

2. The method of claim 1 wherein the imageable material comprises an infrared absorber.

3. The method of claim 1 wherein the imageable material comprises an ultraviolet absorber.

4. The method of claim 1 wherein the imageable material comprises a colorant that absorbs the curing radiation.

5. The method of claim 4 wherein the colorant comprises carbon black, red shade yellow, violet black, or a combination thereof.

6. The method of claim 1 wherein the imageable material comprises a colorant that absorbs the curing radiation, an infrared absorber, an ultraviolet absorber, and a binder.

7. The method of claim 1 wherein the imageable film comprises a subbing layer disposed between the imageable material and the mask substrate.

8. The method of claim 1 wherein the imageable film comprises an ablatable layer.

9. The method of claim 8 wherein the ablatable layer comprises polycyanoacrylate and an infrared dye.

10. The method of claim 8 wherein the ablatable layer is disposed between the mask substrate and the imageable material.

11. The method of claim 8 wherein the ablatable layer is disposed on the exposed surface of the imageable material.

12. The method of claim 1 wherein the imaging radiation has a wavelength between about 750-1200 nm.

13. The method of claim 1 wherein the step of imagewise exposing the film to imaging radiation results in removal of the imageable material exposed to the imaging radiation.

14. The method of claim 13 wherein a receptor sheet collects the imageable material exposed to the imaging radiation.

15. The method of claim 1 wherein the step of laminating the imaged film to an imageable article comprises:
(i) heating the imageable article; and
(ii) contacting the imaged film with the releasing layer of the imageable article.

16. The method of claim 15 wherein the step of laminating the imaged film to the imageable article further comprises applying heat and pressure to the imaged film and the imageable article after the step of contacting the mask image with the releasing layer.

17. The method of claim 1 wherein the photosensitive material comprises an ultraviolet-curable material.

18. The method of claim 1 wherein the releasing layer comprises polyvinyl alcohol, methylcellulose, or hydrolized styrene maleic anhydride, or derivatives or combinations thereof.

19. The method of claim 1 wherein the photosensitive material is disposed on a photosensitive substrate.

20. The method of claim 1 wherein the imageable article is a flexographic printing plate precursor.

21. The method of claim 1 wherein the step of exposing the imageable article to the curing radiation induces photo-polymerization of the photosensitive material.

22. The method of claim 1 wherein the curing radiation includes ultraviolet radiation.

23. The method of claim 1 wherein the step of exposing the imageable article to the curing radiation is performed at ambient pressure.

24. The method of claim 1 wherein the step of developing the imageable article comprises contacting the imageable article with a developer.

25. The method of claim 1 wherein the relief image has a depth in the range of about 150 to about 750 microns.

26. The method of claim 1, further comprising the steps of:
(f) laminating the imaged film to a second imageable article;
(g) exposing the second imageable article without vacuum draw-down to curing radiation through the imaged film;
(h) removing the imaged film from the second imageable article; and
(i) developing the second imageable article to form a second relief image.

27. The method of claim 26 wherein the steps (f)-(i) are repeated with additional imageable articles.

* * * * *